(12) United States Patent
Yap et al.

(10) Patent No.: US 9,520,525 B1
(45) Date of Patent: Dec. 13, 2016

(54) METHOD OF MAKING AN OPTICAL DETECTOR

(71) Applicant: HRL Laboratories, LLC, Malibu, CA (US)

(72) Inventors: Daniel Yap, Newbury Park, CA (US); Rajesh D. Rajavel, Oak Park, CA (US); Sarabjit Mehta, Calabasas, CA (US); Hasan Sharifi, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/594,050

(22) Filed: Jan. 9, 2015

Related U.S. Application Data

(62) Division of application No. 13/036,403, filed on Feb. 28, 2011, now Pat. No. 8,969,986.

(51) Int. Cl.
 *H01L 21/00* (2006.01)
 *H01L 31/18* (2006.01)
 *H01L 27/146* (2006.01)

(52) U.S. Cl.
 CPC ..... *H01L 31/1844* (2013.01); *H01L 27/14685* (2013.01)

(58) Field of Classification Search
 CPC ............................ H01L 31/0236; Y02E 10/50
 USPC ............................................. 257/432; 438/29
 See application file for complete search history.

(56) References Cited

U.S. PATENT DOCUMENTS

| | | | |
|---|---|---|---|
| 4,183,035 A | 1/1980 | Wang et al. | |
| 4,496,788 A | 1/1985 | Hamakawa et al. | |
| 4,675,525 A | 6/1987 | Amingual et al. | |
| 5,080,725 A | 1/1992 | Green et al. | |
| 5,239,179 A | 8/1993 | Baker | |

(Continued)

FOREIGN PATENT DOCUMENTS

JP 05259427 10/1993

OTHER PUBLICATIONS

Green et al., "Very High Efficiency Silicon Solar Cells—Science and Technology", IEEE Transactions on Electron Devices, vol. 46, No. 13, Oct. 1999, pp. 1940-1947.*

(Continued)

*Primary Examiner* — Matthew Landau
*Assistant Examiner* — Igwe U Anya
(74) *Attorney, Agent, or Firm* — Ladas & Parry

(57) ABSTRACT

An infrared photo-detector with multiple discrete regions of a first absorber material. These regions may have geometric shapes with sloped sidewalls. The detector also may include a second absorber region comprising a second absorber material that absorbs light of a shorter wavelength than the light absorbed by the multiple discrete absorber regions of the first absorber material. The geometric shapes may extend only through the first absorber material. Alternatively, the geometric shapes may extend partially into the second absorber region. The detector has a metal reflector coupled to the multiple discrete absorber regions. The detector also has a substrate containing the discrete absorber regions and the second absorber region. The substrate can further include geometric shaped features etched into the substrate, with those features formed on the side of the substrate opposite the side containing the discrete absorber regions and the second absorber region.

13 Claims, 11 Drawing Sheets

(56) References Cited

U.S. PATENT DOCUMENTS

| | | | | |
|---|---|---|---|---|
| 5,485,015 | A | * | 1/1996 | Choi .................. H01L 31/0236 250/338.4 |
| 5,581,084 | A | | 12/1996 | Chapman et al. |
| 5,721,429 | A | | 2/1998 | Radford et al. |
| 5,963,790 | A | | 10/1999 | Matsuno et al. |
| 6,294,723 | B2 | | 9/2001 | Uematsu et al. |
| 6,410,917 | B1 | | 6/2002 | Choi |
| 6,504,222 | B1 | * | 1/2003 | Miyamoto ............ B82Y 20/00 250/338.1 |
| 6,545,289 | B1 | | 4/2003 | Gunapala et al. |
| 6,852,920 | B2 | | 2/2005 | Sager et al. |
| 6,858,462 | B2 | | 2/2005 | Zaidi et al. |
| 6,967,345 | B1 | * | 11/2005 | Gunapala ............... B82Y 20/00 257/14 |
| 7,129,104 | B2 | | 10/2006 | Gunapala et al. |
| 7,545,051 | B2 | | 6/2009 | Yang et al. |
| 7,928,389 | B1 | * | 4/2011 | Yap .................... H01L 31/0236 250/338.4 |
| 7,977,637 | B1 | * | 7/2011 | Yap ........................ B82Y 20/00 250/338.4 |
| 8,946,839 | B1 | * | 2/2015 | Yap ................... H01L 27/14607 257/431 |
| 2002/0125472 | A1 | * | 9/2002 | Johnson ................ B82Y 20/00 257/21 |
| 2002/0135869 | A1 | | 9/2002 | Banish et al. |
| 2003/0199113 | A1 | * | 10/2003 | Gunapala ............... B82Y 20/00 438/22 |
| 2004/0045932 | A1 | | 3/2004 | Kochergin et al. |
| 2005/0109388 | A1 | | 5/2005 | Murakami et al. |
| 2006/0251995 | A1 | | 11/2006 | Wille et al. |
| 2008/0072958 | A1 | | 3/2008 | Dutta |
| 2009/0001278 | A1 | * | 1/2009 | Jones ................ H01L 27/14647 250/370.13 |
| 2011/0037097 | A1 | * | 2/2011 | Scott ..................... B82Y 20/00 257/184 |

OTHER PUBLICATIONS

M. Vuillermet, F. Pistone and Y. Reibel, "Latest developments in MCT for next generation of infrared staring arrays," Proceedings SPIE, vol. 7481, pp. 74810F1-12, (2009).

G. Destefanis, et al., "Bi-color and dual-band HgCdTe infrared focal plane arrays at DEFIR," Proceedings SPIE vol. 6206, pp. 62060R1-15 (2006).

A. Sinton, et al., "27.5 Percent Silicon Concentrator Solar Cells," IEEE Electron Device Letters, vol. EDL-7, No. 10, pp. 567-569, (Oct. 1986).

R. Brendel, et al., "Ultrathin crystalline silicon solar cells on glass substrates," Applied Physics Letters, vol. 70, No. 3, pp. 390-392 (Jan. 20, 1997).

Campbell and M. A. Green, "Light trapping properties of pyramidally textured surfaces," Journal of Applied Physics, vol. 62, No. 1, pp. 243-249 (Jul. 1987).

P. Obermeyer, et al., "Advanced light trapping management by diffractive interlayer for thin-film silicon solar cells," Applied Physics Letters, vol. 92, pp. 181102-1-181102-3 (2008).

C. Haase and H. Stiebig, "Thin-film silicon solar cells with efficient periodic light trapping texture," Applied Physics Letters, vol. 91, pp. 061116-1-061116-3, (2007).

T. Ashley, et al., "Epitaxial InSb for elevated temperature operation of large IR focal plane arrays," Proceedings of SPIE, vol. 5074, pp. 95-102, (2003).

M.A. Green, J. Zhao, A. Wang, and S.R. Wenham, "Very High Efficiency Silicon Solar Cells—Science and Technology," IEEE Transactions on Electron Devices, vol. 46, No. 10, pp. 1940-1947, (Oct. 1999).

L. Hu and G. Chen, "Analysis of Optical Absorption in Silicon Nanorwire Arrays for Photovoltaic Applications," Nano Letters, vol. 7, No. 11, pp. 3249-3252, (Nov. 2007).

B.M. Kayes, H.A. Atwater, and N.S. Lewis, "Comparison of the device physics principles of planar and radial p-n. junction nanorod solar cells," J. Applied Physics, vol. 97, p. 114302-1-114302-11, (May 2005).

P. Klipstein, "XBn Barrier Photodetectors for High Sensitivity and High Operating Temperature Infrared Sensors," Proceedings of SPIE, vol. 6940, pp. 69402U-1-69402U-12, (2008).

A. Rogalski, "Journal of Applied Physics," vol. 93, No. 8, pp. 4355-4391, (Apr. 15, 2003).

R. M. Swanson, S.K. Beckwith, R.A. Crane, W.D. Eades, Y.H. Kwark, R.A. Sinton and S.E. Swirhun, " Point-Contact Silicon Solar Cells," IEEE Transactions on Electron Devices, vol. ED-31, No. 5, pp. 661-664, (May 1984).

Technical Information Document (SD-12), Characteristics and use of infrared detectors, by Hamamatsu Photonics K. K. pp. 1-43, (2004).

N. Tokranova, I. Levitsky, B. Xu, J. Castracane, and W. Euler, "Hybrid Solar Cells Based on Organic Materials Embedded Into Porous Silicon," Proceedings. SPIE, vol. 5724, pp. 183-190, (2005).

H. Yuan, G Apgar, J. Kim, J Laquindanum, V. Nalavade, P. Beer, J. Kimchi, Ted Wong, "FPA Development: from InGaAs, InSb to HgCdTe," Proceedings of SPIE, vol. 6940, paper 69403C, 11 pages, (2008).

J. Zhao, A. Wang, P. Campbell, and M.A. Green "A 19.8% Efficiency Honeycomb Multicrystalline Silicon Solar Cell with Improved Light Trapping," IEEE Transactions on Electron Devices, vol. 46, No. 10, pp. 1978-1983, (Oct. 1999).

From U.S. Appl. No. 13/036,403 (now U.S. Pat. No. 8,969,986), Restriction Requirement dated Sep. 4, 2013.

From U.S. Appl. No. 13/036,403 (now U.S. Pat. No. 8,969,986), Non-Final Office Action dated Mar. 31, 2014.

From U.S. Appl. No. 13/036,403 (now U.S. Pat. No. 8,969,986), Notice of Allowance dated Oct. 10, 2014.

From U.S. Appl. No. 12/544,788 (now U.S. Pat. No. 7,928,389), Notice of Allowance dated Dec. 13, 2010.

* cited by examiner

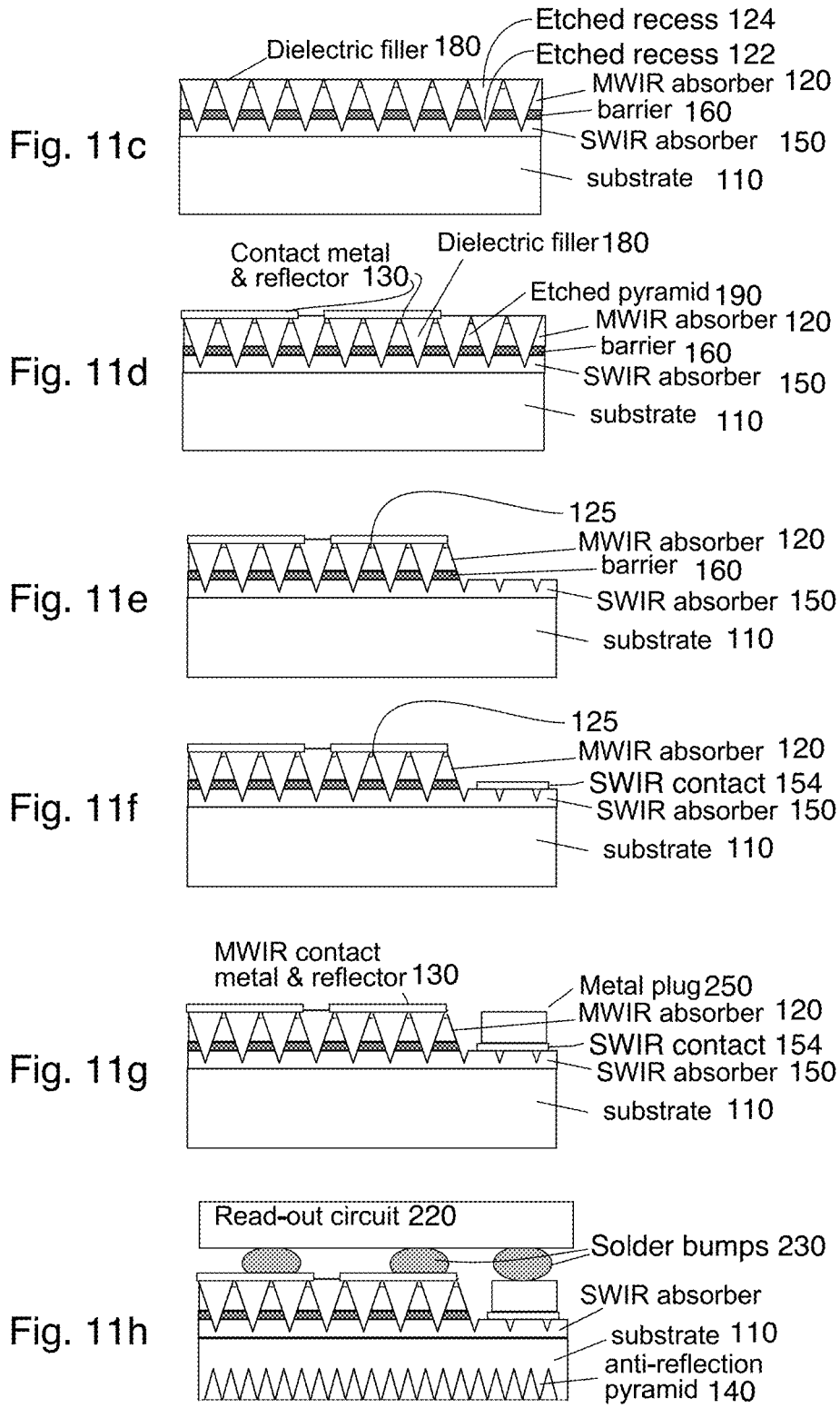

METHOD OF MAKING AN OPTICAL DETECTOR

CROSS REFERENCE TO RELATED APPLICATIONS

This application is related to U.S. patent application Ser. No. 12/554,788 filed Aug. 20, 2009.

TECHNICAL FIELD

An infrared detector which may be disposed in arrays of detectors for an infrared focal-plane array imager.

BACKGROUND

Infrared imagers have many possible applications and can be used for vehicle collision avoidance, perimeter surveillance, engine diagnosis and monitoring, missile seeking, and large-area imagers. The disclosed dual-band infrared photodetector array and imager can operate at much higher temperature while still achieving high sensitivity. The higher operating temperature (>150-200K) made possible by the disclosed invention could greatly reduce the size and cost of the infrared imagers since cryogenic cooling would not be needed. The higher temperature operation could reduce the cost of platforms containing such imagers and could improve the reliability of their infrared sensors. The possibility of operating at temperatures achievable with thermo-electric-coolers increases the breadth of commercial applications since the imagers and detector arrays would be more affordable.

Most prior detectors of infrared imagers have pixels that are defined by etching mesa structures that contain the light absorbing layer. FIG. 1a shows the cross-sectional structure and FIG. 1b shows a perspective view of a prior dual-band detector in which the mesa structure is formed by etching through the absorbing layer for one wavelength band but not etching the mesa through the absorbing structure for a second wavelength band. See M. Vuillermet, F. Pistone and Y. Reibel, "Latest developments in MCT for next generation of infrared staring arrays," *Proceedings SPIE*, Vol. 7481, 2009, p. 74810F. In each pixel of this detector, the detecting regions for the two bands are slightly offset from each other. Also, each diode detector of a given pixel has a separate electrical contact, thereby allowing true simultaneous detection of light in the two wavelength bands. There is a layer comprising wider bandgap material (the NIR barrier) located between the two light-absorbing layers that prevents electrical short-circuiting between the two diodes. This barrier blocks both the electrons and the holes. In general, the light-absorbing layer that absorbs the shorter-wavelength light is located closer to the incident light, which is the layer located closer to the substrate in the case shown in the figure.

In the pixels of other prior detectors, the light absorbing regions for the two wavelength bands are stacked directly above each other and both of these light-absorbing layers are located within the same mesa. See G. Destefanis, et al., "Bi-color and dual-band HgCdTe infrared focal plane arrays at DEFIR," Proceedings SPIE Vol. 6206, 2006, p. 62060R. This structure is illustrated in FIGS. 2a and 2b. Each pixel consists of two back-to-back N-on-P photodiodes. Each pixel has one independent contact and also has a contact that is common to the other pixels of the array. The two photodiodes of a pixel are electrically contacted and biased through the single contact located on the top of the mesa and through the common contact located on the substrate side of the structure. By switching the bias voltage for a pixel from a positive value to a negative value, it is possible to extract the photodetected signal from one or the other P/N junction photodiode.

We recently invented a single band detector (albeit having very wide bandwidth) that has a reduce volume of its light-absorbing material. This detector contains multiple pyramid shaped features formed in each pixel, with those pyramids located on the side of the detector facing the incident light. See U.S. patent application Ser. No. 12/554,788 filed Aug. 20, 2009 and FIG. 6 thereof. The pyramids are etched into the light absorbing layer. The pyramids are etched only partly through the light-absorbing layer so that there remains a physically continuous base region of the light-absorbing layer to permit the majority carriers to be conducted to electrical contacts formed at the edges of the detector array. This detector also contains mesas etched through the heavily doped collector or extractor layer of the P/N diode. The mesas are not formed in the main light-absorbing layer and the mesas face away from the incident light. The pixel-specific electrical contact for a given pixel is formed onto these collector mesas. The spatial extent of a given pixel is defined by the electrical contact made to these mesas. There can be more than one mesa for each pixel and there are multiple pyramids in each pixel. As a variation of this detector structure, the mesas can be made to have the shape of shallow pyramids. Those mesas also can be coated with a metal reflector that conforms to the shape of the mesas.

In our prior detector of FIG. 3 herein, the light is incident from the side containing the pyramids rather than from the substrate side of the detector. Thus, this detector is unlike the prior detectors illustrated in FIGS. 1 and 2. But a potential weakness of our prior detector and detector array is that its substrate must be removed in order to fabricate its mesas and electrical contacts and to form the electrical connections between that detector array and the electronic readout circuit. Thus the resultant thin detector-array structure of FIG. 3 is more difficult to fabricate and to integrate with the readout circuit.

For the detectors of FIGS. 1a, 1b and 2, the pixel for the longer-wavelength band is defined by the single mesa of that pixel. For the detector of FIG. 3, the pixel for the single band is defined by the extent of the electrical contact made to the one or more collector mesas comprising a pixel. The electrical contact made to the light-absorbing layer is the common contact of the detector array. The pyramid-shaped regions of the light-absorbing layer do not specifically define the extent of a pixel but rather they extend throughout the light-facing surface of the array.

Besides our prior detector of FIG. 3, there are no other infrared detector structures to our knowledge that have pyramids or other such geometric shapes formed on both opposing sides of the detector. There are, however, prior solar cells that have pyramids or other surface texture etched into the substrate, with that textured surface facing the incident light (see FIG. 4). See A. Sinton, et al., "27.5 percent silicon concentrator solar cells," IEEE Electron Device Letters, Vol. EDL-7, no. 10, October 1986, p. 567. The textured surface reduces the front-surface reflection of the incident light and improves the coupling of that incident light into the solar cell. Since the substrate material of the solar cell absorbs the incident light, their pyramids for reducing the front-surface reflection of incident light are etched partially through the light-absorbing material of the solar cell.

There also are prior solar cells that have geometrically shaped features formed both on the side facing the incident light as well as on the side facing away from the incident light. See R. Brendel, et al., "Ultrathin crystalline silicon solar cells on glass substrates," Applied Physics Letters, Vol. 70, no. 3, 20 Jan. 1997, p. 390. These geometric features are formed into both sides of a substrate such as glass, which is transparent to the light to be absorbed by the solar cell. Then a laterally continuous, or contiguous, film of light-absorbing material is formed onto one shaped side of the substrate (see FIG. 5). Solar cells that have pyramids or other geometrical shapes formed on both sides of the substrate were analyzed and found to have improved trapping and absorption of the incident light. See Campbell and M. A. Green, "Light trapping properties of pyramidically textured surfaces," Journal of Applied Physics, Vol. 62, no. 1, July 1987, p. 243. For the solar cells described by Brendel et al., one set or both sets of electrical contacts can be formed on the side of the solar cell that faces away from the incident light. That side of the solar cell is covered with flat metal reflectors that also serve as electrical conductors to those electrical contacts.

In other prior solar cells, geometric shapes such as pyramids are formed into one side of a first slab of transparent conducting oxide material. One or two layers of thin, but laterally continuous, light-absorbing materials are formed above the shaped surface of the transparent conducting oxide. See P. Obermeyer, et al., "Advanced light trapping management by diffractive interlayer for thin-film silicon solar cells," Applied Physics Letters, Vol. 92, p. 181102 (2008) and C. Haase and H. Stiebig, "Thin-film silicon solar cells with efficient periodic light trapping texture," Applied Physics Letters, Vol. 91, p. 061116 (2007). The side of the contiguous light-absorbing layers opposite that first transparent conducting oxide slab also has a pyramidal shape. That opposite side of the top-most absorbing layer is covered with a second slab of transparent conducting oxide. This second slab of transparent conducting oxide has a shaped surface facing the light-absorbing layers and a flat surface facing away from the light-absorbing layers. The flat surface of the second slab of transparent conducting oxide then can be covered with a metal reflector. For these solar cells, the electrical contacts are formed on both opposing sides of the light-absorbing layers with electrical connections provided by means of the transparent conducting oxide material.

Many high-sensitivity focal-plane photo-detector arrays for detecting light at mid-wave infrared (MWIR) wavelengths or longer need to be cooled to cryogenic temperatures (e.g., 77K and lower) in order to sufficiently reduce their internally produced noise current to levels that are below the background noise of the scene. However, cryogenic coolers, such a Stirling coolers, are bulky and they involve moving parts that can reduce the reliability of the overall system. If the operating temperature of the detector array can be increased to 200° K and higher, it approaches the range of temperatures that can be attained by thermoelectric (TE) coolers that do not involve moving parts. If the operating temperature can be increased even to 150-200° K, it can be cooled by radiative means for imagers used in space. Thus, there is a need for infrared detector arrays that can operate with low noise current at temperatures of 150° K and higher.

The noise current of an un-illuminated infrared detector, or its dark current, has several major components. One component is a generation/recombination current (G/R current) that is limited by G/R centers at material interfaces such a homojunctions or heterojunctions in the detector. Another component is a diffusion current that, for high quality materials, is limited by thermal generation in the bulk of the light-absorbing material. Yet another component is a surface-recombination current due to interface electronic states resulting from un-passivated dangling chemical-bonds at the outer boundaries of the detector semiconductor material. For many common infrared detector materials, such as HgCdTe and antimony-based compounds, the G/R current typically dominates the dark current at low temperatures, such as below 120-150K. However, at higher temperatures, the diffusion current and the thermal generation current within the bulk absorber regions dominate the dark current.

One way to reduce the ratio of diffusion current to G/R current at the higher operating temperatures is to reduce the volume of the absorber material. However, this reduction of absorber volume typically also results in a reduction of the photon absorption efficiency or quantum efficiency of the infrared detector. The disclosed detector achieves both reduced diffusion current as well as high quantum efficiency to permit operation at higher temperatures. The reduced diffusion current is accomplished by reducing the volume of absorber material, for a given input cross-sectional area of detector array or, alternatively, a given pixel area. The high quantum efficiency is achieved by using geometrical features that greatly reduce the net front-side reflection of the incident light and also that trap the incident light such that the light makes multiple passes through the absorber regions.

FIG. 6 shows results from calculations of the absorbance (normalized absorption) of a detector comprising a uniform thickness of MWIR (MidWave Infra Red) absorbing material for various wavelengths of incident light. Such a detector structure is representative of the mesa structures of FIGS. 1 and 2 as well as the planar structure for the shorter-wavelength detecting portion of FIG. 1. These calculations assumed an InSb light-absorbing material but the disclosed detector array actually could comprise any light-absorbing material that absorbs light at the desired range of wavelengths for its two detection bands. The results indicate that the thickness of the absorbing layer should be at least twice the wavelength of the incident light in order to achieve maximum broadband absorbance. For thinner absorbing layers, there are strong oscillations in the dependence of absorbance on layer thickness that can be associated with multi-pass optical cavity effects (Fabry-Perot cavity resonances). Since it is desirable to reduce the volume of absorber material, a typical prior detector could have a metal reflector located at the side of the detector opposite the incident light. This metal reflector has greater reflectance that the reflection associated with just the high refractive index of the light-absorbing material, thereby improving the detector quantum efficiency, especially at the wavelengths of the Fabry Perot resonances.

The results in FIG. 6 also show that the absorbance obtained for very thick layers of absorber approaches a value of approximately 0.6. This low absorbance is due to the front-surface reflection of the light, since the refractive index of the absorber material is much larger than 1. Many prior detectors have anti-reflection (AR) coatings that comprise one or more layers of dielectric films that have the desired combination of film thickness and refractive index to minimize the reflection at specific wavelengths of the incident light. However, it is difficult to obtain AR coatings that are suitable for a wide range of incident wavelengths, such as a range approaching one octave. Also, it is difficult to obtain AR coatings for dual-band detection unless the wavelengths of those two bands are multiples of each other. Thus, it would be very difficult to obtain an AR coating that provides low reflection at 0.9-1.6 micron wavelength as well as at 3.0-5.0 micron wavelength, for example. There remains a need for a multi-band infrared detector that has low front-side reflection as well as high external quantum efficiency at all detected bands.

BRIEF DESCRIPTION OF THE INVENTION

One aspect regarding the presently disclosed technology is that the absorber regions comprise discrete islands of light-absorbing material having a geometric shape and preferably a trapezoidal shape and thus the volume of that light absorber is reduced substantially compared absorber volume of a detector having a uniform-thickness absorber layer.

In one aspect the present invention relates to an array of photodetectors respective to incident light comprising: a substrate formed of a material which is transparent to said incident light which, in use, impinges a first major surface of said substrate; each photodetector in said array comprising: a plurality of multiple discrete regions of a first optical absorber material, each discrete region having a geometric shape which it shares in common with the other discrete regions of the first optical absorber material, the common geometric shape having sloping sidewalls which angle towards a tip of said common geometric shape, said plurality of multiple discrete regions of the first optical absorber material being disposed on or adjacent a second major surface of said substrate; and a separate metal reflector and contact layer which contacts or adjoins the tips of the multiple discrete regions of the first optical absorber material.

In another aspect the present invention relates to a method of making an optical detector, the method including: forming a first optical absorber material on or adjacent a substrate; etching recesses into the first optical absorber material to define a set of multiple discrete absorber regions formed of said first optical absorber material, each discrete absorber region having a geometric shape which it shares in common with the other discrete absorber regions, the common geometric shape having sloping sidewalls which angle towards a tip of said common geometric shape, a combined volume of the discrete absorber regions being smaller than a volume of etched recesses; and forming a metal reflector in contact with the tips of the discrete absorber regions.

BRIEF DESCRIPTION OF THE DRAWINGS

FIGS. 11a-11h depict preferred steps in the fabrication of the detector array of FIG. 7.

DETAILED DESCRIPTION

Figure 7:
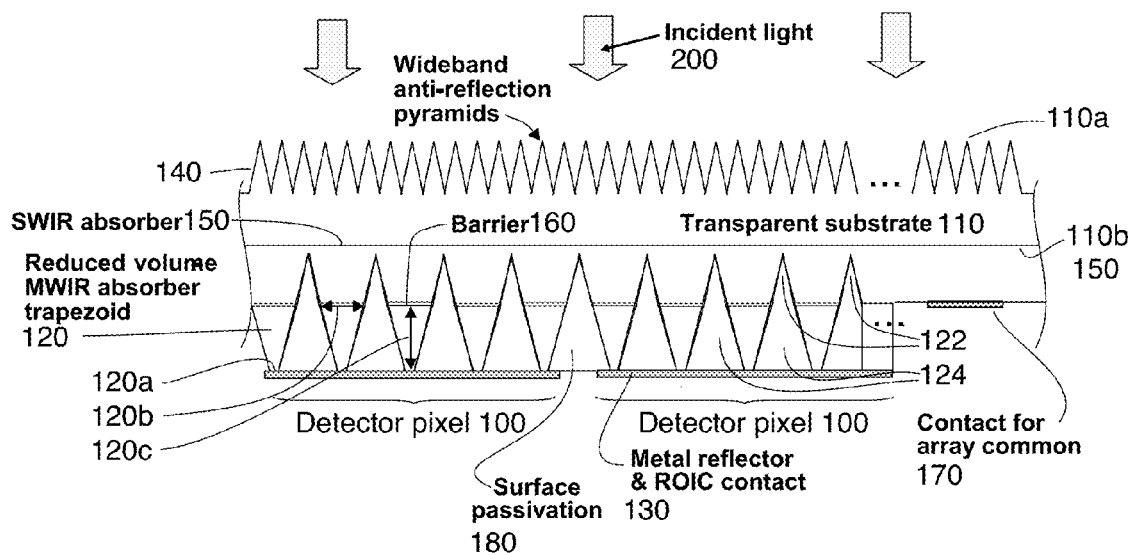
FIG. 7 is a side elevation schematic view of a portion of an infrared focal-plane array imager with two (of many) detector pixels shown.

In one embodiment, the present invention is a photo-detector array for an infrared focal-plane array imager. The main features of the disclosed detector array are illustrated in FIG. 7 which is a side sectional view of two detector pixels 100 of many such detector pixels 100 in an array of such detector pixels of an infrared focal-plane array imager. A side sectional view of the array taken at a ninety degree angle to the section depicted by FIG. 7 is basically identical to the view of FIG. 7, except that the common contact for the array may be omitted since only one such contact is required (although multiple such contacts may be utilized if desired, and thus it may appear in a side sectional view of the array taken at a ninety degree angle to the section depicted by FIG. 7.

Figure 11A:
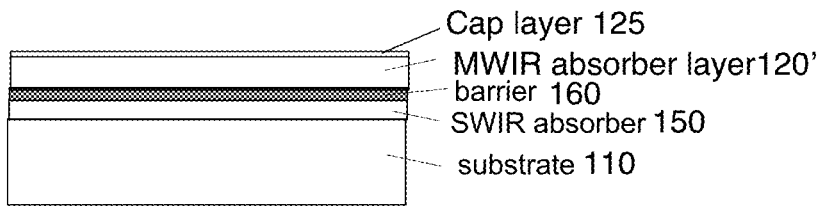
Figure 11B:
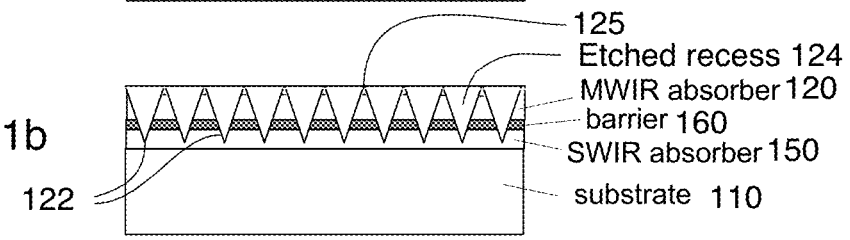

The detectors (or detector pixels or photodetectors) 100 of this array comprises multiple discrete or separated regions 120 of a first layer of light-absorbing material 120' (see FIG. 11a) disposed either on a substrate 110 that is transparent to the incident light 200 to be absorbed or on a layer 150 of layer of light-absorbing material disposed on the substrate 110. These first light-absorbing material regions 120 formed in layer 120' preferably have a trapezoidal shapes (when viewed in a side view such as FIG. 7) but could alternatively have pyramidal or conical shapes. A trapezoidal shape, with a flattened pointed end, is preferred as the flattened pointed end should make a better electrical contact with contact 130 and, moreover, a trapezoidal shape tends to result when trying to form a pyramidal shape at the feature sizes involved in these detectors. The substrate 110 comprises material that preferably is transparent to all wavelengths of the incident light 200 to be sensed by each detector 100. The first light-absorbing material regions 120 are located on or near the side 110b of the substrate opposite the side 110a facing the incident light. Each detector 100 also comprises a metal reflector and electrical contact 130 that is disposed immediately adjacent the tips 120a of the multiple trapezoidal light-absorbing regions 120. The side 110a of the substrate 110 facing the incident light 200 has other pyramid shaped features 140 formed in it (these features 140 appear as triangles in the side elevational view of FIG. 7). Thus, the photodetector 100 has geometric shapes formed on both of its opposing sides. As discussed below, there also is a portion of the substrate into which the pyramid shapes do not extend.

Each photodetector 100 preferably has a second layer of light-absorbing material 150 whose absorption cut-off wavelength is shorter than the absorption cut-off wavelength of the material comprising the multiple discrete regions 120. The light absorbing material 150 may be disposed between the substrate 110 and the light absorbing material 120. These portions of differing light-absorbing materials may be separated by a barrier layer 160 that passes minority carriers but blocks majority carriers generated in the light-absorbing layers 120, 150. The first light-absorbing regions 120 are formed from a layer of the first light-absorbing material that has deep trapezoid-shaped recesses 124 formed in it. These trapezoid-shaped recesses 124 preferably extend completely through that layer of first light-absorbing material 120 (and preferably into layer 150 thereby forming recesses 122 therein), so that first light-absorbing material layer forming regions 120 is discontinuous, thereby forming multiple, discrete absorbing regions 120. In FIG. 7, the trapezoid shaped recesses 124 extend completely through the barrier layer 160 and into the second layer of light-absorbing material 150. Alternatively, the trapezoidal shaped recesses 124 could extend only through the first light-absorbing layer and then stop at the barrier layer 160 such that the barrier layer remains continuous. Another alternative has the trapezoid-shaped recesses 124 stop at substrate 110, especially if layer 150 is omitted.

The first layer 120 may have a material that absorbs light of a first wavelength band, such as the mid-wave infrared (MWIR) wavelengths. The second layer 150 may have material that absorbs light of a second wavelength band, such as the near infrared (NIR) and/or short-wave infrared (SWIR) wavelengths, but that is nominally transparent to the light of the first wavelength band. Without implying a limitation, NIR is approximately 0.7 to 1.4 microns, SWIR is approximately 1.4 to 3.0 microns and MWIR is approximately 3.0 to 8.0 microns.

Continuing with FIG. 7, each detector pixel 100 has an individual electrical contact 130, with the lateral extent of that electrical contact defining the spatial extent of the pixel detector 100. FIG. 7 also shows a portion of the array containing a common electrical contact 170. The embodiment of FIG. 7 illustrates two-band detectors 100 that absorbs light of MWIR and SWIR wavelengths. Each detector 100 has multiple regions of MWIR absorber material 120 and a region of SWIR absorber material 150. The MWIR absorber in a given pixel preferably consists of multiple discrete regions that preferably have a trapezoidal shape, although other shapes such as pyramids and cones also are suitable. The SWIR absorber region of a pixel is continuous but may have recesses 122 formed in it, as illustrated by FIG. 7, due to the formation of the aforementioned trapezoid-shaped recesses 124. The SWIR absorber 150 and MWIR absorber 120 are preferably separated by barrier 160. Barrier 160 preferably has an electronic band structure that passes minority carriers of at least the MWIR absorber and possibly also of the SWIR absorber but that blocks the majority carriers of both absorbers, and forms heterojunctions with the absorber materials. Alternatively, barrier 160 could be obtained by doping such that it forms a NPN or PNP back-to-back diode structure with the SWIR 150 and MWIR 120 absorber materials. The barrier 160 of a pixel could comprise multiple discrete regions, as illustrated in FIG. 7, or it could comprise a continuous region, as mentioned above. The substrate 110 consists of a material that is preferably transparent to the wavelengths of light to be detected by the SWIR and MWIR absorber regions 150, 120. The material of the SWIR absorber 150 is transparent for the wavelengths of light to be detected by the MWIR absorber regions 120. The SWIR absorber 150, in combination with barrier 160, serves as a transparent collector for the MWIR detector to extract the carriers photo-generated in the MWIR absorber regions 120. Also, the MWIR absorber regions 120, in combination with barrier 160 serve as collector regions for the SWIR detector to extract the carriers photo-generated in the SWIR absorber 150. Each detector pixel 100 also preferably contains regions of material 180 that provides electronic surface passivation for the exposed surfaces of the absorber and barrier regions. This surface passivation material 180 also could fill in the voids 124 between the MWIR absorber trapezoids 120, including the optional recesses 122 formed in the SWIR absorber 150, as illustrated in FIG. 7. Alternatively, the surface passivation 180 material could comprise a thin film that conformally covers the exposed surfaces of the absorber and barrier regions.

The substrate 110 is located closest to the incident light 200 and is followed, in succession, by the SWIR absorber 150, the barrier 160 and then the MWIR absorber regions 120. The side of the substrate facing the incident light preferably has a texture 140 etched into its surface 110a. The surface texture can be a set of pyramids, as illustrated by the triangular shapes in the side elevation view of FIG. 7. Other suitable surface textures include pillars, cones, ridges, holes and inverted pyramids and cones. The surface texture 140 acts to provide anti-reflection of the incident light 200 for a wide range of wavelengths of light that includes the wavelengths absorbed by the SWIR 150 and MWIR 120 absorbers. The surface texture 140 also serves to slightly deflect the angle of the light coupled into the substrate and toward the absorbers. Each detector pixel 100 also includes a broadband reflector such as a metal reflector 130 that is located at the tips 120a of the trapezoidal absorber regions 120. The reflector 130 preferably has a flat surface rather than a surface that conforms to the sides of the trapezoids (that is, the tips 120a of the trapezoidal absorber regions 120 may penetrate into reflector 130 slightly but preferably without having reflector 130 conform to the sides of the trapezoidal absorber regions 120). Also, a portion of the reflector 130 is preferably spaced away from the trapezoidal absorber regions 120 and thereby defines one or more voids 124 between adjacent trapezoidal absorber regions 120. The refractive index of the absorber materials 120, 150 is much higher than the refractive index of the surface passivation 180 or of any voids 122, 124 between the trapezoidal regions (if either no surface passivation 180 is applied or if the surface passivation 180 is a thin film as previously mentioned). The geometry of the detector 100 structure enhances the trapping of incident light such that the light makes multiple passes through the regions 120 of the MWIR absorber and even through the SWIR absorber 150, preferably many more than two passes. This increased number of passes of the light to be absorbed can cause the disclosed detector to have better quantum efficiency per unit volume of absorber material than the prior detectors discussed above. Light that is not absorbed on a first pass through the absorber regions can be reflected by the metal reflector 130 as well as deflected and/or reflected by the sloped walls of the trapezoidal absorber regions 120 or by the sloped walls of the recesses 122 such that the light makes additional passes through the absorber regions 120, 150.

Figure 8:
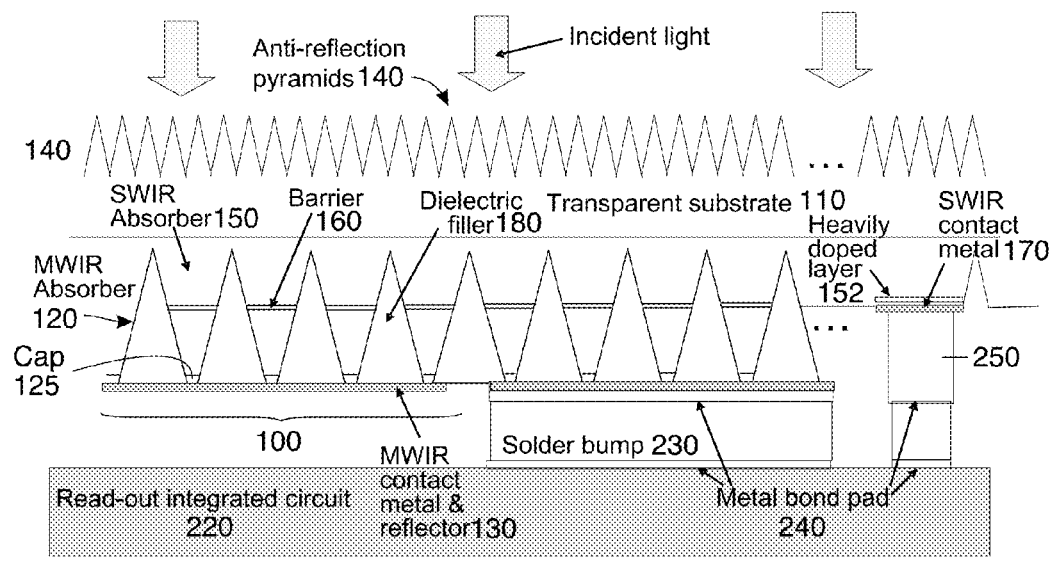
FIG. 8 shows the detector array of FIG. 7 coupled to a read out circuit.

Additional details regarding the disclosed detector array are shown and discussed with reference to FIG. 8. As previously mentioned, each detector pixel 100 has an electrical contact 130, which preferably is an ohmic contact, that is formed at (immediately adjacent) the tips 120a of the trapezoidal absorber regions 120. This electrical contact 130 provides extraction of the photo-generated carriers resulting from the light detected by the associated detector pixel 100. A cap layer 125 of more heavily doped material of relatively small bandgap may be grown on the MWIR absorber layer forming regions 120 so that the tips 120a of the trapezoidal absorber regions 120 may be formed by this cap layer 125. The detector array also can include a second set of electrical contacts 170 that are made to the SWIR absorber 150. This second set of contacts 170 serve as the array-common contacts and generally are common to multiple pixels 100 of the array. Regions of heavily doped material 152 may be formed in the SWIR absorber 150 at these contacts to facilitate the achievement of ohmic contacts. The detector array also may include metal plugs 250 and bond pads 240 as well as solder bumps 230 that are used to provide electrical connections between the array of detectors 100 and a read out integrated circuit 220. A focal plane array imager could thus include the disclosed detector array coupled to a read-out integrated circuit 220.

Figure 9A:
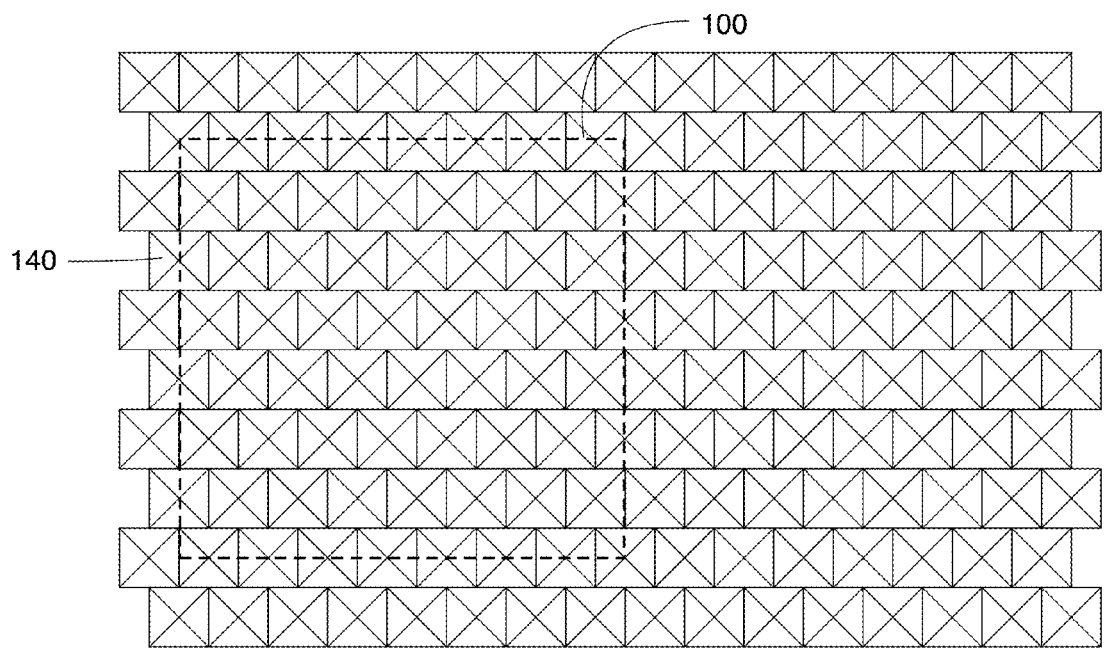
FIG. 9a is the top view and FIG. 9b is the bottom view of detector structure with pyramidal anti-reflection structures and trapezoidal absorber regions, but with differing numbers of pyramidal anti-reflection structures and trapezoidal absorber regions per pixel.

In order to obtain good anti-reflection for all wavelengths of light to be detected, the width of the pyramids of the texture 140 etched into surface 110a of substrate 110 preferably are as large as or smaller than 2-times the shortest wavelength of the light to be absorbed by the detector pixels 100. Thus, if the shortest wavelength of absorbed light is 1.5 micrometers, the width of the pyramids at their base should be at most 3 micrometers. The height of the pyramids of the texture 140 etched into surface 110a of substrate 110 is preferably on the order of the longest wavelength of the light to be absorbed. Thus, if the MWIR light to be absorbed has a 3-5 micrometer wavelength, the height of the pyramids should preferably be around 3 to 5 micrometers. These dimensions for the height and width are by way of example and not limitation. The pyramids of the texture 140 etched into surface 110a of substrate 110 form a continuous pattern on the side of the substrate of the detector facing the incident light, as illustrated in FIG. 9a. A given detector pixel 100 will include many pyramidal structures in layer 140. Those pyramids can be arranged in a staggered manner, as illustrated in FIG. 9a. Alternatively, those pyramids may be arranged in any other pattern or formed in any other shape that provides a desired anti-reflection and photon retention property.

The size of the trapezoidal absorber regions 120 is generally larger than the size of the pyramids of the AR surface texture 140. The width of the tip 120a of each absorber region 120 should be smaller than the shortest wavelength of the MWIR band to be absorbed. The width of the base 120b of each trapezoidal absorber region 120 is on the order of the longest wavelength of the MWIR band to be absorbed. The height 120c of each trapezoidal region 120 preferably is equal to or greater than the longest wavelength of the MWIR band to be absorbed. Thus, for example and not to imply a limitation, if the MWIR band is 3-5 microns, the trapezoid may have a 5 micron base width, a 2 micron tip width and a 5 micron height 120c.

Figure 9B:
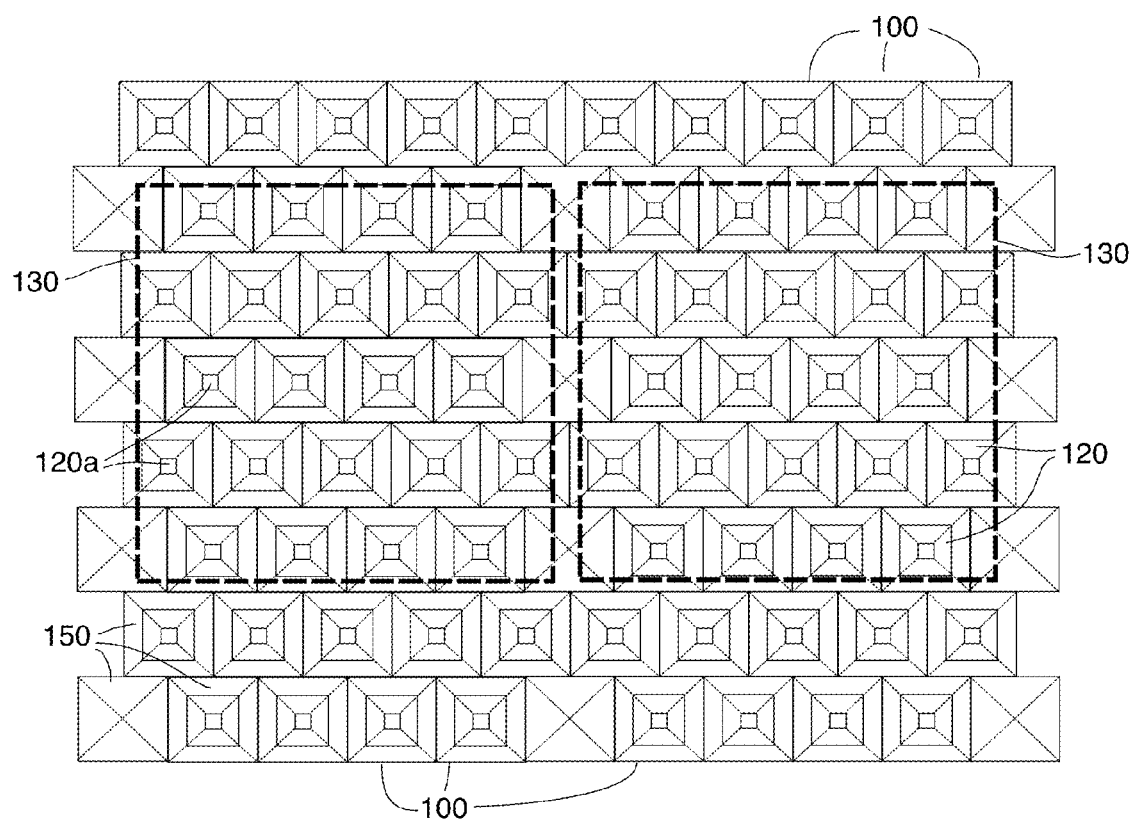
Figure 10:
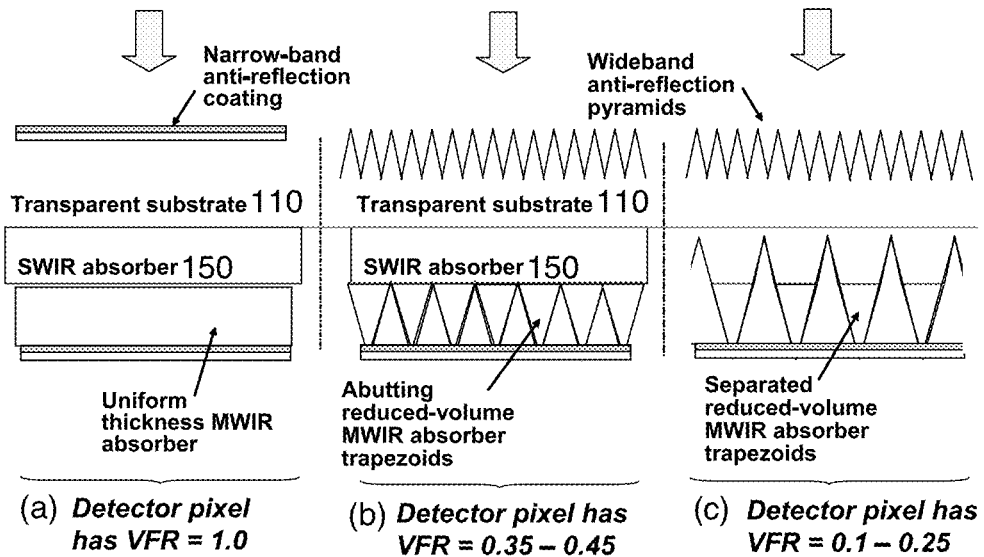
FIG. 10 illustrates the volume fill ratio (VFR) of MWIR absorber material for several detector structures.

The bases 120b of adjacent trapezoidal absorbers 120 may touch each other such that both the barrier 160 and the SWIR absorber layer 150 are contiguous (as illustrated in portion (b) of FIG. 10) if no recesses 122 are formed in the SWIR absorber 150. For the example mentioned above in the preceding paragraph, this means the center-to-center spacing between each trapezoidal absorber region 120 would be about 5 microns. Alternatively, the bases of adjacent trapezoidal absorber regions 120 will have gaps or spaces between them such that their bases do not touch each other when recesses 122 are formed in the SWIR absorber layer 150. This configuration is illustrated in FIGS. 7, 8, 9b and portion (c) of FIG. 10. In this case, the trapezoidal MWIR absorber regions 120 preferably are the upper portions of larger trapezoids that also include the barrier 160 and part of the adjacent SWIR absorber 150. As the trapezoidal MWIR absorber regions are located farther and farther apart, the volume fill ratio (VFR) of the MWIR absorber 120 is reduced. A uniform thickness absorber layer (illustrated in portion (a) of FIG. 10) has a volume fill ratio of 1.0. A detector structure with trapezoidal MWIR absorber regions 120 whose bases touch has a volume fill ratio of 0.35 to 0.45 (depending on the specific dimensions of the trapezoids). A detector structure with trapezoidal MWIR absorber regions 120 whose bases do not touch can have a volume fill ratio of 0.35 to 0.1, or smaller.

The array of detector pixels 100 has electrical contacts 130, defining the individual pixels, that are made to the MWIR absorber regions 120. The contact 130 for a given pixel 100 can be connected to multiple trapezoidal region tips 120a, and there can be many trapezoidal regions of MWIR absorber 120 associated with one pixel 100 as illustrated in FIG. 9b.

One possible fabrication process for the disclosed array of detectors 100 begins with the epitaxial growth of the SWIR absorber layer, the barrier and the MWIR absorber layer on an appropriate substrate wafer 110. See FIG. 11a. One example of a suitable substrate material 110 is GaAs onto which a SWIR absorber material 150, such as InAlAsSb or InGaAsSb, is grown. The barrier layer 160 may comprise combinations of materials such as AlAsSb, GaAlSb, or InGaAlSb. The MWIR absorber regions 120 may comprise materials such as InAsSb, InSb, or InGaAsSb. The absorber layers 120, 150 are preferably un-intentionally doped (preferably undoped) or lightly doped. The barrier 160 could be un-intentionally doped (preferably undoped) or intentionally doped. The cap layer 125 of a more heavily doped material of relatively small bandgap may be grown above the MWIR absorber layer 120' (see FIG. 11a) used to form MWIR absorber regions 120. This cap layer 125 facilitates the formation of ohmic contact between the MWIR absorber regions 120 and the metal contacts 130.

Alternatively, the HgCdTe family of alloys can be utilized to fabricate the detectors formed by the absorber materials in layers 120', 160. By adjusting the mole fraction (X) of $Hg_{1-X}Cd_XTe$, the bandgap can be adjusted to cover wavelengths from the SWIR to the VLWIR (Very Long Wave InfraRed) bands. HgCdZnTe alloys can be utilized as the barrier 160 layer.

The detector array fabrication steps, which are illustrated by FIGS. 11a-11h, include the patterned etching of the trapezoidal shapes to define the regions 120 in the MWIR absorber layer 120'. First, recesses 124 are etched into a MWIR absorber layer 120' which recesses may extend beyond the MWIR layer 120', penetrating through the barrier 160 and into the underlying SWIR absorber layer 150 to form recesses 122 therein as shown, for example, in FIGS. 7, 8, and 11b. The sloping sidewalls of regions 120 in the MWIR absorber layer 120' preferably continue as sloping sidewalls which penetrate into the underlying SWIR absorber layer 150, each sloping sidewall which penetrates into the underlying SWIR absorber layer 150 preferably sharing a common plane with the adjacent sloping sidewall of the adjacent region 120. Etched recesses of various sidewall angles as well as sidewall curvatures can be obtained by combinations of dry etching (such as reactive ion etching or ion milling) and wet-chemical etching processes. The exposed surfaces of MWIR and SWIR absorber material and barrier material 160 can be coated with a surface passivation or dielectric layer 180. The passivation layer 180 can be a thin film or it can be thicker and completely or partially fill the voids 122, 124 between adjacent trapezoidal shaped regions 120. See FIG. 11c. In one embodiment, the etched recesses 122, 124 can be filled with a low-index dielectric material 180 such as silicon dioxide, polyimide or benzo-cyclobutene. Electrical contacts can be made to the tips 120a of the MWIR absorber regions 120 (and to the caps 125 if formed at the tips 120a) by making sure no dielectric of layer 180 covers the tips 120a of the trapezoidal regions and then by patterned deposition of appropriate contact metals 130 onto the detector wafer. See FIG. 11d. Materials such as TiAu and TiPtAu could be used for these metal contacts. The contact metal 130 also preferably serves as an optical reflector as previously disclosed.

The detector array also has a common electrical contact 170 that is shared by multiple detector pixels 100. This contact 170 makes electrical connection to the SWIR absorber layer 150. If layer 150 is not used, then contact 170 is made to the substrate 110 instead and recesses 122 may then penetrate into substrate 110. The steps related to fabrication of this common contact 170 are now discussed with reference to FIGS. 11e-11h. These steps include removal of the MWIR 120' and barrier material 160 from the vicinity of that common contact 170 as needed to expose the underlying SWIR absorber layer 150. See FIG. 11e. Also, heavily doped regions 152 (see also FIG. 8) can be formed in the exposed SWIR absorber by means such as ion implantation and annealing to facilitate the fabrication of ohmic contact to the wider bandgap SWIR absorber material 150. Then, contact metals 154 such as TiAu, TiPtAu or AuGeNiAu can be deposited onto the exposed (and preferably doped) region of SWIR absorber. See FIG. 11f. A metal plug 250 also can be formed by means such as electroplating to make the top of the plug coplanar with the metal pads for the individual-pixel contacts. See FIG. 11g. This facilitates connection of the detector array to a readout circuit 220 using solder bumps 230. See FIG. 11h.

Before mounting to a readout circuit 220, the detector wafer can be mounted temporarily onto a carrier wafer (not shown) such that the back side 110a of the detector substrate (the transparent substrate 110) is exposed. The substrate 110 can then be thinned, as needed, to a desired thickness and can be patterned for etching of the AR texture 140 (preferably formed by the previously mentioned pyramid shapes 140) into that back side, as also illustrated in FIG. 11h. After the AR texture 140 is etched, an optional layer (not shown) of material, such as a high temperature wax, resin or removable polymer, can be temporarily deposited onto that back side 110a to protect the texture 140 from physical damage during subsequent manufacturing operations. The completed detector wafer can then be demounted from the carrier wafer and mounted onto an appropriate readout circuit 220, by known means such as the aforementioned solder bumps 230. The temporary protective coating deposited on the back side 110a of the substrate 110 can be removed after the detector array has been mounted onto the readout circuit 220.

Figure 12:
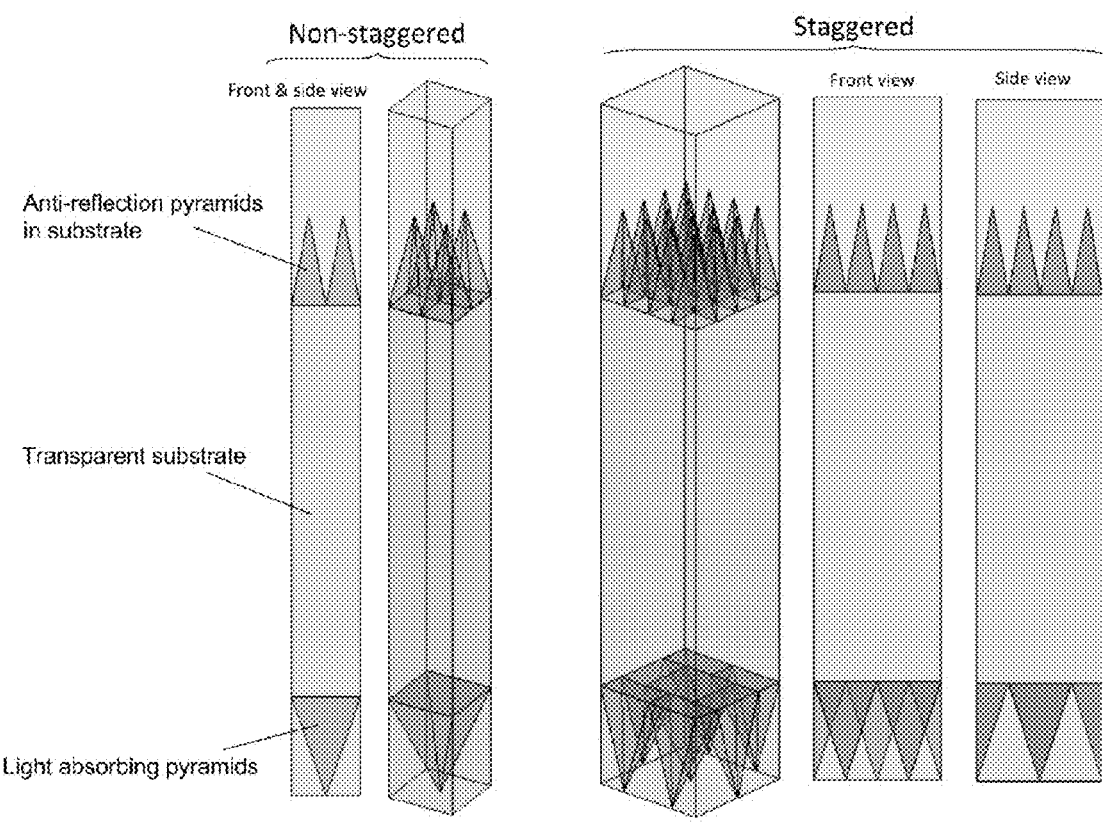
FIG. 12 provides examples of models for EM simulations of the detector pixel.

FIGS. 9a and 9b show, respectively, staggered arrangements of the anti-reflection pyramid shapes of layer 140 and the trapezoidal absorber regions 120. However other arrangements also are possible, such as grid-like (non-staggered) arrangements or even somewhat random arrangements. Examples of a grid-like arrangement and a staggered arrangement are shown in FIG. 12. Note that for these regular arrangements, there can be a base repetition period of the geometric structures. FIG. 12 shows examples of a basic structure or unit cell that can be repeated or arrayed to produce the overall structure of the detector. This basic structure can be used as a model for electro-magnetic simulations that analyze the optical characteristics of the detector. For example, it is possible to calculate the net front-surface reflectance of the incident light and the net absorbance of the light, for various wavelengths of that light. These calculations can be made for various dimensions of the pyramid 140 and trapezoid 120 and recess 190 as well as various values of the substrate 110 thickness.

Figure 13:
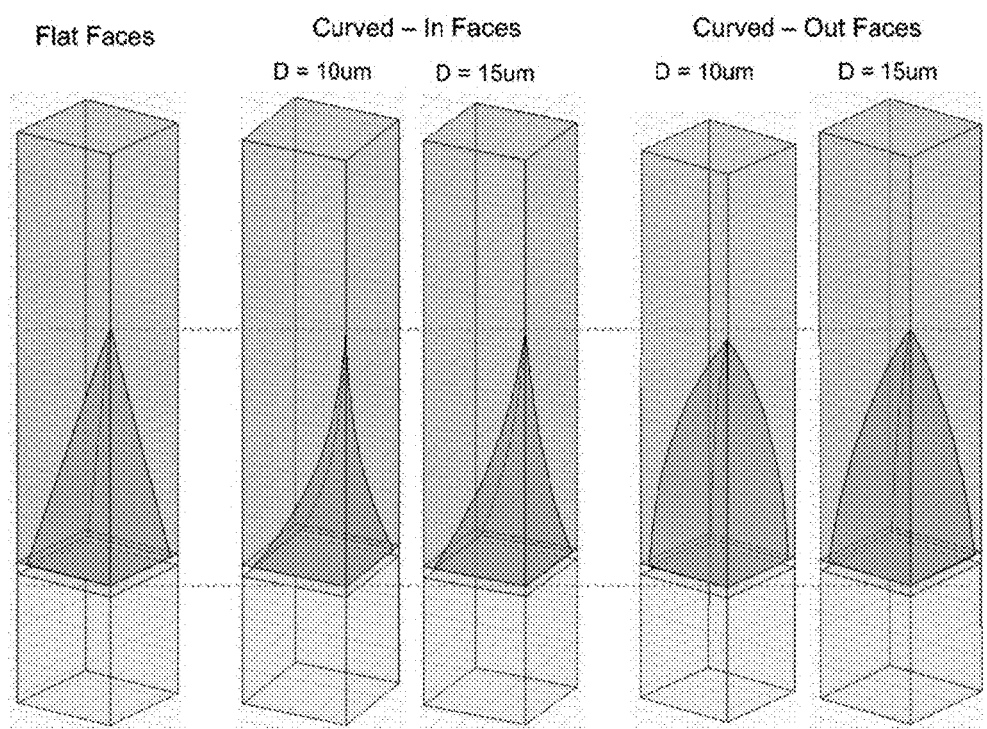
FIG. 13 provides examples of models for EM simulations of structures with curved sidewalls.

The sidewalls of the pyramids and the trapezoids could be curved rather than flat, as illustrated in FIG. 13. Also, those sidewalls could be curved inward or curved outward. The effect of sidewall curvature on the front-side reflection and on the photon capture by the detector is more pronounced for the relatively shorter wavelengths. The pyramids and the trapezoids also could be asymmetric. For example different sidewalls could be tilted at different angles. Or, some sidewalls could be flat and other sidewalls could be curved.

Embodiments like those shown in FIGS. 12 and 13 can be used to calculate the effects of the arrangement of the trapezoidal absorbers and of the spacing between adjacent absorber regions (which affects the volume fill ratio) on the net absorbance of a detector. In this way, one can determine the effect of absorber geometry and arrangement on the value of a figure of merit such as the net absorbance per unit volume of absorber material. For diffusion-current limited noise, that absorbance per unit volume gives an indication of the anticipated signal-to-noise performance of the detector. For a prior-art detector that has an absorber layer of uniform thickness, the thickness of that absorber layer often is chosen to maximize its absorbance per unit volume figure of merit. For the disclosed detector, additional parameters such as the spacing, bandwidth and sidewall angles of the shorter-wavelength (e.g., MWIR) trapezoid-shaped absorber regions, the angle of the pyramids in the substrate and the shape of the recesses in the longer-wavelength (e.g., SWIR) absorber layer also could be selected to maximize the absorbance per unit volume figure of merit, for some given wavelength bands and incidence angles of the light to be detected.

Figure 1A:
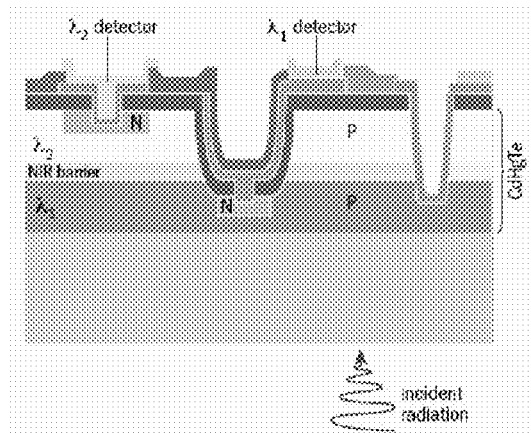
FIGS. 1a and 1b depict a prior art dual band detector with two independent electrical contacts for extracting the photo-currents from the two bands.
Figure 1B:
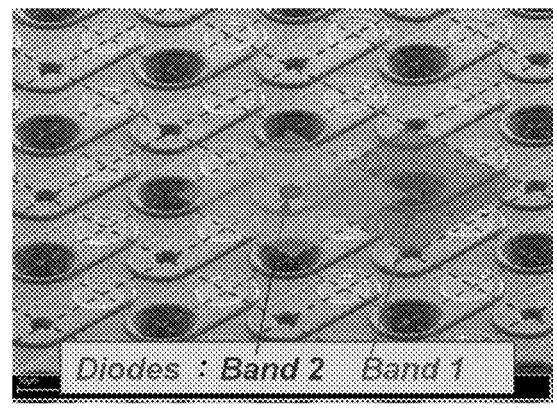
Figure 2A:
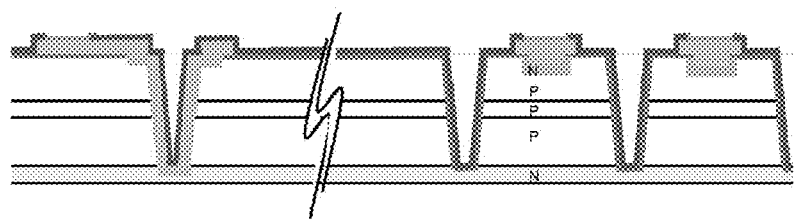
FIGS. 2a and 2b depict a prior art dual band detector with one independent contact shared by both P/N diodes of a given pixel.
Figure 2B:
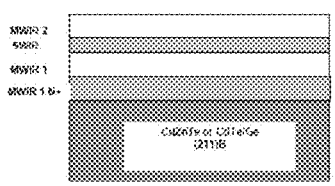
Figure 5:
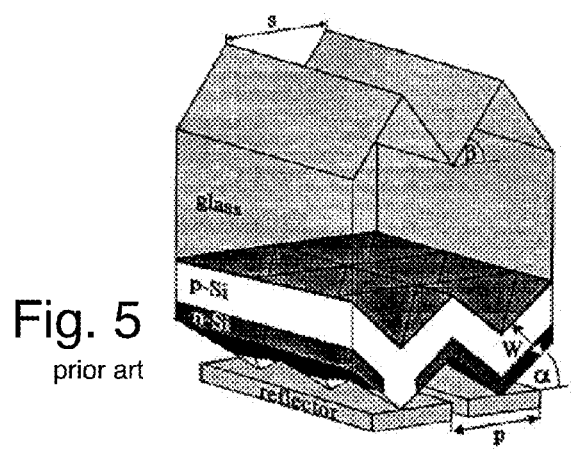
FIG. 5 shows a prior art solar cell with shaped absorber formed above a shaped substrate.
Figure 3:
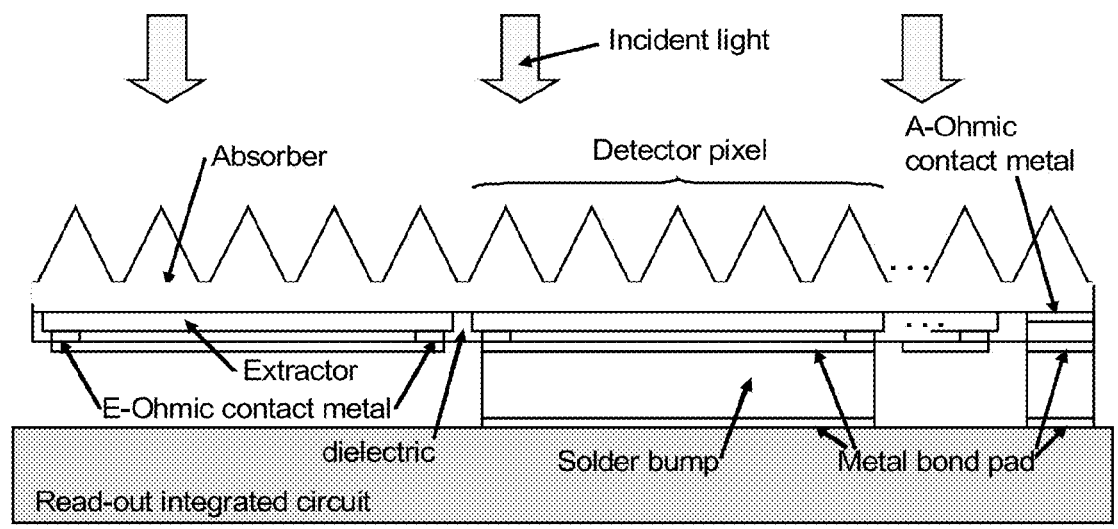
FIG. 3 depicts a reduced volume single-band detector with pyramid shapes etched into the light-absorbing layer.
Figure 4:
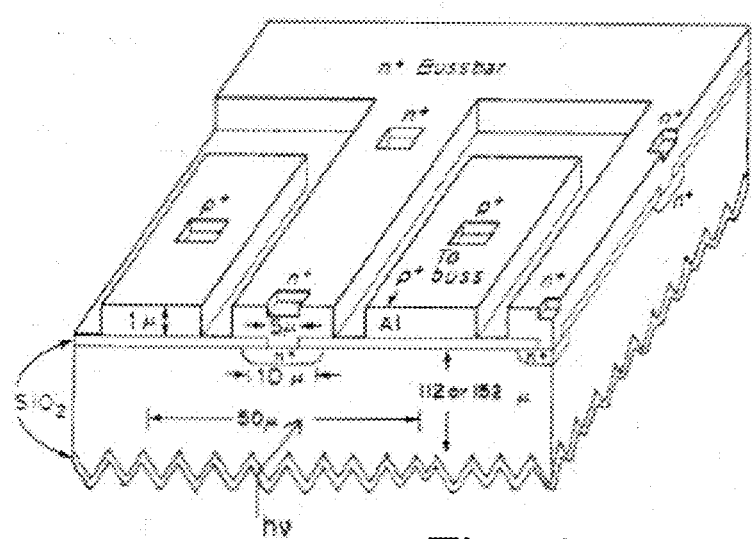
FIG. 4 shows a prior art solar cell with pyramid-shaped features etched into its substrate.
Figure 6:
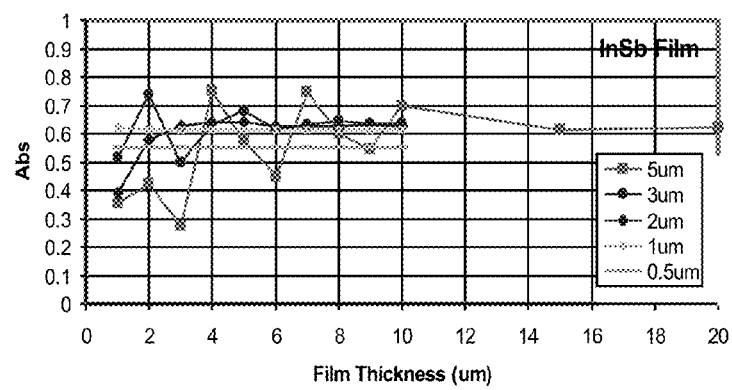
FIG. 6 is a graph showing the dependence of the absorbance of a uniform-thickness absorbing layer on the layer thickness and the wavelength of the incident light
Figure 14A:
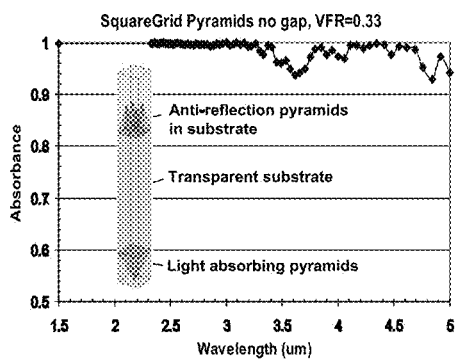
FIGS. 14a-14c show the calculated absorbance of exemplary MWIR detector structures with (FIG. 14a) zero gap between absorber regions on a square grid, (FIG. 14b) 1.5 micron gap between staggered absorber regions and (FIG. 14c) 3.0 micron gap between staggered absorber regions.
Figure 14B:
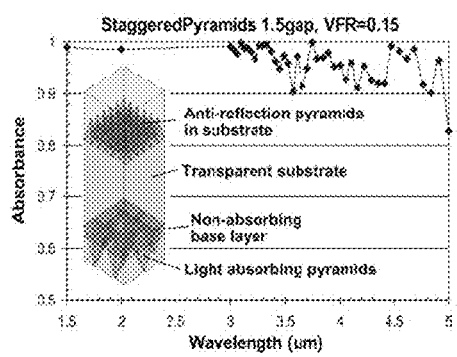
Figure 14C:
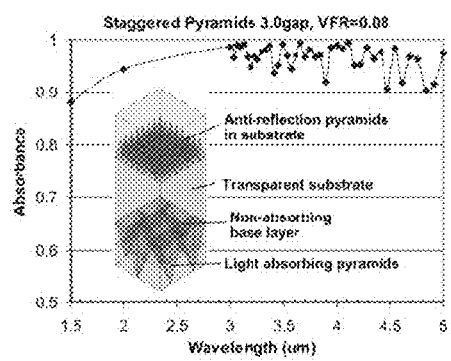

FIGS. 14a-14c show examples of the calculated absorbance obtained with several exemplary arrangements of the multiple discrete absorbers and the pyramid-shaped AR texture 140 with the calculated absorbance of exemplary MWIR detector structures with (a) zero gap between absorber regions on a square grid (see FIG. 14a); (b) 1.5 micron gap between staggered absorber regions (see FIG. 14b); and (c) 3.0 micron gap between staggered absorber regions (see FIG. 14c). The calculations were done using HFSS, a 3D electromagnetic field simulation and analysis tool from Ansoft Corporation. The results, obtained for an exemplary InSb MWIR absorber illustrates the effect of the spacing between the discrete absorber regions 120, which have a pyramid shape in this case. It also illustrates the effect of the geometric arrangement of the absorber regions. The absorbance of the detector is quite high, above 90%, even though the volume of absorber material is reduced to 0.33 and even to 0.08 the volume of a uniform-thickness absorber layer. So the volume of voids 124 is then preferably between 0.67 and 0.92 of the total volume of both the voids 124 and the MWIR absorber regions 120. For these cases, the smaller volume fill ratio was obtained by keeping the dimensions of the MWIR absorber regions 120 the same but increasing the spacing between them. For the structures in which the bases of the MWIR absorber regions do not touch each other, those absorber regions actually comprise only the upper portions of larger pyramids that extend into material that do not absorb the MWIR light. When compared to the results shown in FIG. 6, the results of FIGS. 14a-14c indicate that the disclosed detector is effective in reducing the absorber volume, and thus the dark current noise of the detector, while also achieving high absorption efficiency for incident light over a broad range of wavelengths.

The photo-detecting element or pixel 100 of the disclosed photo-detector array has reduced volume of the photon-absorber material for achieving reduced dark current (and improved noise performance) at temperatures higher than cryogenic temperatures (e.g., at temperatures of 150-200° K and higher, depending on the cut-off wavelength of its light-absorbing material). The photo-detecting element has geometric features that increase the capture and retention of incident photons (especially the longer-wavelength light) so that the quantum efficiency of the photo-detector is high even though its absorber volume is reduced. The photo-detecting element also contains geometric features that reduce the net front-side reflection of the incident light, over a large multi-octave range of photon energies or optical wavelengths so that low reflection is obtained even for detectors that operate in multiple optical-wavelength bands (such as at both the entire SWIR and the entire MWIR bands). One aspect of the presently disclosed detector is that its preferably trapezoidal-shaped absorber regions 120 comprise discrete islands of a light-absorbing material and the volume of those islands of light-absorbing material is reduced substantially compared to the absorber volume of a detector with a uniform-thickness absorber layer.

Alternative Embodiments

The embodiments described above are only exemplary. Many other variations beyond those already mentioned are possible. For example, although those embodiments contain multiple absorber regions for the longer-wavelength detection band that are separated, it also is possible for the disclosed detector to have an absorber that is not discrete but rather that has the trapezoidal regions 120 (or regions of other shapes) connected together. The VFR would be higher in that case but a higher VFR could still be acceptable for some applications (such as those involving lower operating temperature and/or absorber material with shorter cutoff wavelength). Also, the SWIR absorber region 150 depicted in the figures could comprise the same material as the substrate 110. In that case, the detector could be used to detect light of a single infrared band rather than two bands. Additionally, the metal reflector 130 need not be a flat sheet but rather could have curved or sloping regions. The main requirement is that the metal reflector 130 layer touches the electrical-contact regions (tips 120a) of the multiple absorber regions 120, since that metal layer also provides the electrical connection between those absorber regions 120 for the majority carriers in those regions.

The embodiments described above have a substrate whose material is GaAs. GaAs is transparent for optical wavelengths of 0.9 microns and longer. Thus, the embodiments set forth above as given are for a first light-absorbing material 120 that absorbs MWIR light and a second light-absorbing material 150 that absorbs SWIR light. It is possible to obtain a detector that also detects near-infrared (NIR) wavelength light and/or visible wavelength light by using a substrate material that is transparent to those wavelengths of light. Examples of such substrates are GaN, SiC and sapphire. High quality substrate wafers of those wide band-gap materials are available from commercial suppliers.

First and second absorber materials made from antimony-based compounds can be epitaxially grown on GaAs substrates. However, growth of the antimony-based compounds on GaN, SiC and sapphire is not a well demonstrated process. One way to form a detector that has layers of the antimony-based materials formed on a wide band-gap substrate is now described with reference to FIGS. 15a-15c.

Figure 15A:
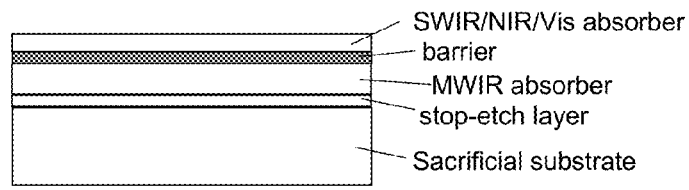
FIGS. 15a-15c show additional steps which may be added to the disclosed fabrication steps to provide a detector array having response at Visible/NearInfraRed wavelengths.
Figure 15B:
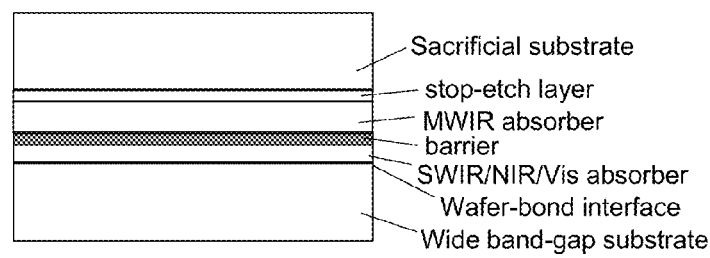
Figure 15C:
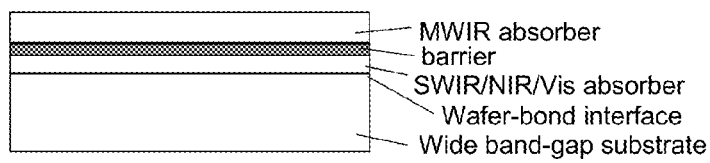

FIGS. 15a-15c illustrates a process in which those absorber and barrier layers are bonded onto a wide band-gap substrate of GaN, SiC or sapphire. First, a stop-etch layer 310, a layer of the first light-absorbing material 120, the barrier layer 160 and then a layer of the second light-absorbing material 150 are grown on a sacrificial substrate 300, such as GaAs. In addition, an optional cap layer of heavily doped first light-absorbing material could be between the stop-etch layer and the layer of first light-absorbing material. The substrate with the grown epitaxial layers can then be wafer bonded onto the wide band-gap substrate $110_{wbg}$ using a known wafer bonding process, such as direct contact between surfaces that are very flat and clean. Those two surfaces are held together by Van der Waals forces. After the bonding, the sacrificial substrate 300 can be removed by thinning that substrate and by etching it away with a selective etchant that attacks only the substrate material 300 but not the material of the stop-etch layer 310. For example, the stop-etch layer 310 could consist of a GaAlSb-based material. There are known wet-chemical etchants and dry etching processes that will etch GaAs but that will not etch the aluminum-containing compound. Finally, another etchant can be used to remove the stop-etch layer 310 and not etch the first light-absorbing material 120.

The remaining fabrication steps for this detector, which also has response at Visible and NIR wavelengths, are preferably similar to the steps shown in FIGS. 11b-11h. The short-wavelength cut-off of the disclosed detector is thus determined by the transparency cut-off of the substrate material $110_{wbg}$. The long-wavelength cut-off of the disclosed detector is determined by the absorption cut-off of the first light-absorbing material. This absorption cut-off wavelength is dependent on the band gap of that first light-absorbing material.

A dual-band detector with a wide band-gap substrate actually could have its second band respond to Visible-SWIR, Visible-NIR or Visible only wavelengths. The absorption cut-off wavelength of that second light-absorbing material determines the long-wavelength edge of that second band. The second light-absorbing layer can be made sufficiently thick that all of the light of that second detection band is absorbed on a single pass through that layer, and thus it does not penetrate into the first light absorbing layer. In this case, that absorption cut-off wavelength also determines the short-wavelength edge of the first detection band.

Besides having the wafer bonding occur directly between the final epitaxially grown layer of the detector and the wide band-gap substrate, such wafer bonding could be facilitated by an intermediate layer or layers of other materials such as silicon dioxide or benzo-cyclo-butene (BCB). When silicon dioxide is used as the intermediate layer, a preferred fabrication approach is to deposit a thin film of silicon dioxide on the final epitaxially grown layer (such as on a layer of second absorber material 150) and another thin film of silicon dioxide on a smooth surface of the wide band-gap substrate. The thickness of these silicon dioxide films is preferably less than 100 nm. When BCB is used as the intermediate layer, thin films of BCB are deposited on both the final epitaxially grown layer and the wide band-gap substrate. Alternatively a thin film of BCB can be deposited on either the final epitaxially grown layer or the wide band-gap substrate. The total thickness of the BCB layers is preferably less than 200 nm.

The wafer bonding is done by pressing the clean silicon dioxide films (or the BCB films) together, preferably in an evacuated chamber. Also, the wafer bonding could be assisted by heating the two bonded pieces to a temperature of several hundred degrees-C or higher. The resulting silicon dioxide layer or BCB layer forms a thin wafer-bond interface layer.

The combination of the wafer-bond interface layer surrounded by the final epitaxially grown layer and by the wide band-gap substrate can act like an optical Fabry Perot cavity. The refractive index of the wafer-bond interface layer is fairly low, approximately 1.5. In comparison, the refractive index of the surrounding materials is much higher, being approximately 3.0-3.5 for the second absorber material and approximately 1.7-1.8, 2.55-2.7, and 2.25-2.35 for sapphire, silicon carbide and gallium nitride, respectively. It is important to keep the thickness of the wafer-bond interface layer sufficiently small that this optical cavity minimally reflects the incident light to be detected. For example, if the shortest wavelength of the incident light to be detected is 450 nm, the thickness of the wafer-bond interface layer can be 450/2/1.5=150 nm. The resulting optical cavity acts as an anti-reflection structure for the 450 nm light and has moderate to low reflection for light of longer wavelengths. However, in terms of minimizing the wideband optical reflection resulting from the wafer-bond interface, it is preferable to have a direct bond between the final epitaxially grown layer and the wide band-gap substrate, rather than use an intermediate interface layer. However, such interface layers can result in a bond that is easier to fabricate or that is more robust.

Figure 16:
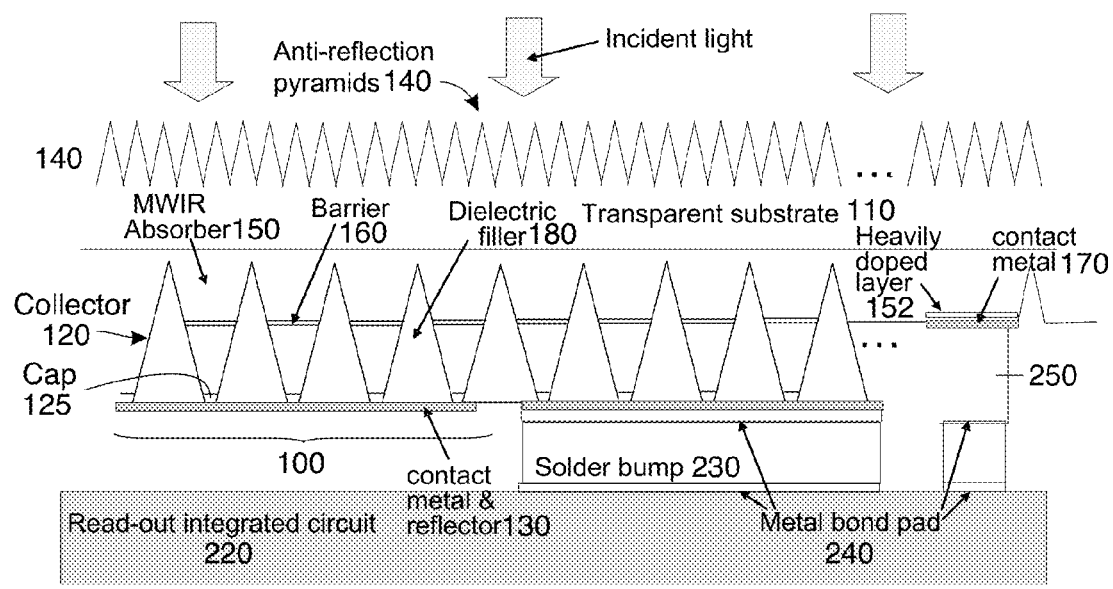
FIG. 16 shows an embodiment where the detector array structure can be used to realize detectors with reduced absorber volume that use a continuous layer to absorb the incident light to be detected

The disclosed detector array structure also can be used to realize detectors with reduced absorber volume that use the continuous layer 150 to absorb the incident light to be detected. In this embodiment, which is depicted by FIG. 16, the thickness of layer 150 is generally not sufficient to completely absorb the incident light in a single pass of that light through layer 150. For example, a detector of MWIR wavelength light could be obtained by making layer 150 from a MWIR absorbing material, examples of which are given above. The trapezoidal regions 120 are then preferably made from a material that is transparent to the MWIR light. For example, the trapezoidal regions could be made from the SWIR absorbing material, examples of which are given above. Although those trapezoidal regions 120 do not absorb the incident light to be detected, they have a high optical refractive index and thus are effective for trapping the light and increasing the number of passes of that light through the absorber layer 150. The regions 120 then serve as MWIR-transparent collector regions 120 to extract the minority carriers that are generated in the MWIR absorber layer 150.

What is claimed is:

1. A method of making an optical detector, the method including:
    forming a first optical absorber material on or adjacent a substrate;
    etching recesses into the first optical absorber material to define a set of multiple discrete absorber regions formed of said first optical absorber material, each discrete absorber region having a geometric shape which it shares in common with the other discrete absorber regions, the common geometric shape having four sloping sidewalls which angle towards a tip of said common geometric shape, a combined volume of the discrete absorber regions being smaller than a volume of etched recesses; and
    forming a metal reflector in contact with the tips of the discrete absorber regions
    forming a second optical absorber material directly on said substrate with said first optical absorber material being formed on or adjacent said second optical absorber material; and
    wherein the substrate is formed of GaAs, the first optical absorber material is formed of InAsSb, InSb, or InGaAsSb and the second optical absorber material is formed of InAlAsSb or InGaAsSb.

2. The method of claim 1 wherein the etching step includes etching recesses into the second optical absorber material through the recesses formed in the first optical absorber material.

3. The method of claim 1 further including forming a barrier between the first optical absorber material and the second optical absorber material.

4. The method of claim 3
    wherein the barrier is formed of combinations of materials such as AlAsSb, GaAlSb, or InGaAlSb.

5. The method of claim 1 further including wherein the step of etching recesses also includes etching recesses into second optical absorber material, the etched recesses penetrating through the first optical absorber material but only partially penetrating the second optical absorber material to define a set of multiple discrete absorber regions formed of said first optical absorber material with said second optical absorber material remaining unitary.

6. The method of claim 5 wherein the first optical absorber material absorbs light of a first wavelength and said second optical absorber material absorbs light of a second wavelength different than said first wavelength.

7. The method of claim 6 wherein the second optical absorber material is essentially transparent to light of the first wavelength.

8. The method of claim 1 wherein the common geometric shape has at least three sloping sidewalls which all angle towards said tip of said common geometric shape.

9. The method of claim 1 wherein the common geometric shape has four sloping sidewalls which all angle towards said tip of said common geometric shape, said common geometric shaped thereby defining at least a portion of a pyramid.

10. A method of making an array of photodetectors responsive to incident light, the method comprising:
    forming a substrate of a material which is transparent to said incident light which, in use, impinges a first major surface of said substrate;
    forming the array of photodetectors wherein each photodetector in said array is formed by:
        forming a plurality of multiple discrete first regions of a first optical material on or adjacent a second major surface of said substrate, each discrete first region having a geometric shape which it shares in common with the other discrete first regions of the first optical material, the common geometric shape having sloping sidewalls which angle towards a tip of said common geometric shape;

forming a second region of a second optical material which is disposed as a unitary region between each of the plurality of multiple discrete first regions of the first optical material and the substrate, the second optical material absorbing light of a shorter wavelength than light absorbed by the multiple discrete absorber regions of the first optical material;

forming a metal reflector and contact layer which contacts or adjoins the tips of the multiple discrete regions of the first optical material, and disposing a barrier between the each of the plurality of multiple discrete regions of the first optical material and the second region of the second optical material, said barrier having an electronic band structure that passes minority carriers of the at least the second optical material but that blocks the majority carriers of both the first and second optical materials.

11. The method of claim 10 wherein the first optical absorber material absorbs light of a first wavelength and said second optical absorber material absorbs light of a second wavelength different than said first wavelength.

12. A method of making an array of photodetectors responsive to incident light, the method comprising:

forming a substrate of a material which is transparent to said incident light which, in use, impinges a first major surface of said substrate;

forming the array of photodetectors wherein each photodetector in said array is formed by:

forming a plurality of multiple discrete regions of a first optical material, each discrete region having a geometric shape which it shares in common with the other discrete regions of the first optical material, the common geometric shape having sloping sidewalls which angle towards a tip of said common geometric shape, said plurality of multiple discrete regions of the first optical material being disposed on or adjacent a second major surface of said substrate;

forming a common integral body of a second optical material which is disposed between the plurality of multiple discrete regions of the first optical material and the substrate, the second optical material absorbing light of given wavelengths, the first optical material being essentially transparent to said given wavelengths;

forming a separate metal reflector and contact layer which contacts or adjoins the tips of the multiple discrete regions of the first optical material; and disposing a barrier between the each of the plurality of multiple discrete regions of the first optical material and the second optical material, said barrier having an electronic band structure that passes minority carriers of the second optical material but that blocks the majority carriers of the second optical material.

13. The method of claim 12 wherein the first optical absorber material absorbs light of a first wavelength and said second optical absorber material absorbs light of a second wavelength different than said first wavelength.

\* \* \* \* \*